United States Patent [19]

Yamada et al.

[11] Patent Number: 4,515,481
[45] Date of Patent: May 7, 1985

[54] APPARATUS FOR PROCESSING A SIGNAL FOR ALIGNING

[75] Inventors: Yasuyoshi Yamada, Kawasaki; Ryozo Hiraga, Yokohama, both of Japan

[73] Assignee: Canon Kabushiki Kaisha, Tokyo, Japan

[21] Appl. No.: 419,511

[22] Filed: Sep. 17, 1982

[30] Foreign Application Priority Data

Sep. 24, 1981 [JP] Japan ................... 56-151530

[51] Int. Cl.³ ............................................. G01B 11/00
[52] U.S. Cl. ................................. 356/400; 356/401; 250/557
[58] Field of Search ............... 356/399, 400, 401; 250/557

[56] References Cited

U.S. PATENT DOCUMENTS

| | | | |
|---|---|---|---|
| 4,167,677 | 9/1979 | Suzki | 356/401 |
| 4,219,719 | 8/1980 | Frosien et al. | 356/401 |
| 4,251,129 | 2/1981 | Suzki et al. | 356/401 |
| 4,406,546 | 9/1983 | Suzuki | 356/400 |

*Primary Examiner*—R. A. Roseberger
*Attorney, Agent, or Firm*—Fitzpatrick, Cella, Harper & Scinto

[57] ABSTRACT

An apparatus for processing a signal for aligning a first object having at least one standard mark thereon with a second object having at least one reference mark thereon, includes a first sensor for sensing the standard mark, second sensor for sensing the reference mark through the first object, an illumination source for illuminating the standard mark and the reference mark, a first extracting circuit for extracting a signal concerning the standard mark from the signal stream of the first sensor, a second extracting circuit for extracting a signal concerning the reference mark from the signal stream of the second sensor, and a signal composing circuit for composing the signal concerning the standard mark and the signal concerning the reference mark.

9 Claims, 8 Drawing Figures

APPARATUS FOR PROCESSING A SIGNAL FOR ALIGNING

BACKGROUND OF THE INVENTION

1. Field of the Invention

This invention relates to an apparatus for sensing alignment marks on two objects when the two objects are to be aligned with each other and producing two signals representing the sensing, extracting a necessary signal component from each of the signals, and composing the extracted signals to obtain a desirable signal.

2. Description of the Prior Art

As an example, during the patterning in the manufacturing process of semiconductors, a wafer and a mask must be aligned with high accuracy and recently, this is usually accomplished automatically. In the automatic aligning, photoelectric detecting means are generally used to detect the position of an object. For example, in an apparatus of the prior art, the object is scanned by using a laser light as a light source and the light beams scattered from alignment mark patterns W and M on the wafer and mask shown in FIGS. 1A and 1B of the accompanying drawings are photoelectrically detected by a photodiode. By utilizing the fact that the output signal thereof includes the information on the distance between the patterns W and M, the relative position of the wafer and mask is detected. Such aligning is accomplished by directing the mark patterns W and M detected in the described manner into a positional relation as shown in FIG. 1C. The mark patterns W and M and a pattern constituting an actual element are in a predetermined relation and therefore, if the mark patterns W and M are directed into a predetermined positional relation, the actual element patterns on the wafer and mask are properly aligned. If the positional relation between the mark patterns W and M is detected, the difference between that positional relation and the predetermined relation may be examined and a driving mechanism may be operated so that this difference becomes null. The aligning of the wafer and mask requires all degrees of two-dimensional freedom to be controlled and is usually accomplished by observing a plurality of locations on the wafer and mask.

The alignment marks depicted in FIGS. 1A and 1B are known from U.S. Pat. No. 4,167,677 of the present assignee.

On the other hand, when the coherent lights coming back from at set of marks on the wafer and mask are detected by a single photoelectric detector, the two lights interfere with each other to provide an unstable signal and this has led to the disadvantage that automatic aligning becomes impossible or the accuracy of aligning deteriorates.

In a specific example shown in FIG. 5 of U.S. Pat. No. 4,251,129 of the present assignee, the light signals from the wafer and mask are detected by different photoelectric detectors, whereby a stable signal is obtained. However, even if great improvements have been made by this apparatus, undesirable signals concerning the mark of another object to be detected can remain in the signals of the detectors.

SUMMARY OF THE INVENTION

It is an object of the present invention to create a signal for aligning two objects with high accuracy.

It is another object of the present invention to obtain an alignment signal in which undesirable signals have been removed from the output signal streams of different sensors when two objects have been sensed by the different sensors.

It is still another object of the present invention to provide an automatic aligning apparatus which separately detects light signals coming back from a mask and a wafer, which are the objects to be aligned, extracts and composes necessary signal components, and effects aligning highly accurately. More specifically, such apparatus produces a plurality of detection signals with a plurality of photoelectric detectors disposed with respect to a mark pattern which is on the object, extracts necessary signal components from each of the detection signals and composes these extracted signals.

It is yet still another object of the present invention to effect coarse alignment of a mask and a wafer, and thereafter effecting fine alignment thereof.

The invention will become fully apparent from the following detailed description thereof taken in conjunction with the accompanying drawings.

DESCRIPTION OF THE PREFERRED EMBODIMENT

Figure 1A:
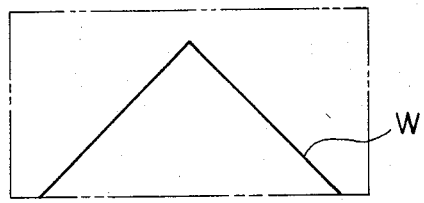
FIGS. 1A, 1B and 1C illustrate the mark patterns of a wafer and a mask.
Figure 1B:
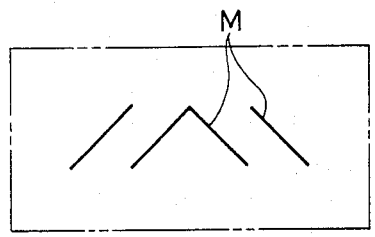
Figure 1C:
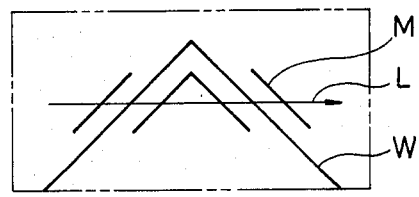
Figure 2:
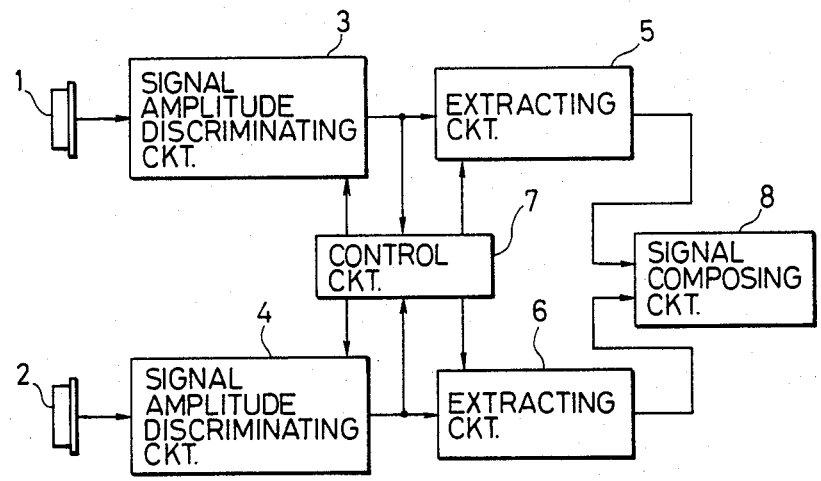
FIG. 2 is a block circuit diagram showing the basic construction of an embodiment of the aligning signal processing apparatus according to the present invention.
Figure 6:
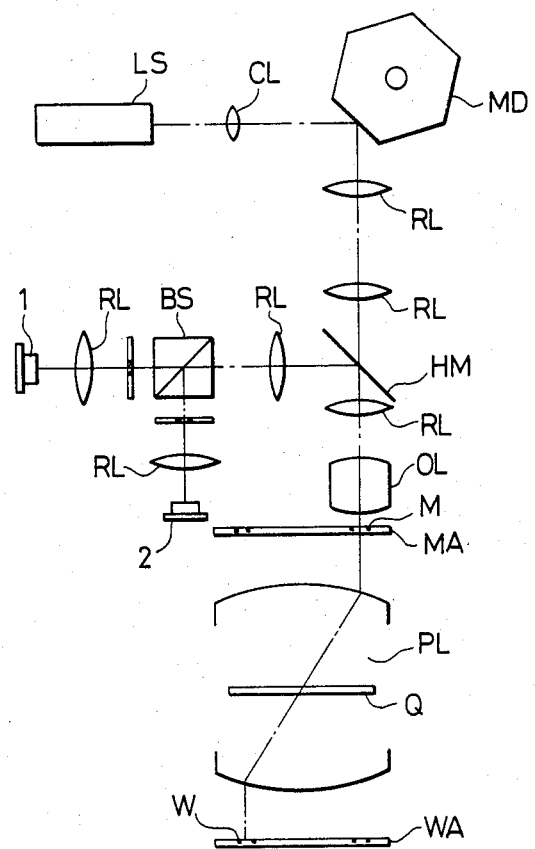
FIG. 6 is a cross-sectional view of a mark detecting optical system.

Referring to FIG. 2, reference numeral 1 designates a first photoelectric detector for detecting a light signal coming back from a wafer, and reference numeral 2 denotes a second photoelectric detector for detecting a light signal from a mask. These photoelectric detectors 1 and 2 are disposed, for example, in the mark detecting device of FIG. 6. In FIG. 6, MA designates a mask provided with a semiconductor circuit pattern, WA denotes a wafer provided with a photoresist layer, and PL designates a projection lens, which makes the mask MA and the wafer WA conjugate. M designates the alignment mark of the mask and W denotes the alignment mark of the wafer. OL designates an objective lens, RL denotes relay lenses, and CL designates a condenser lens. HM designates a half-mirror, MD denotes a mirror drum rotated at a high speed, BS designates a polarizing beam splitter, Q denotes a quarter wave plate, and LS designates a laser light source which produces a linearly polarized laser beam. The laser beam emitted from the laser light source LS scans the marks M and W by means of the mirror drum MD, while the light from the mark W mainly enters the photoelectric detector 1 and the light from the mark M mainly enters the photoelectric detector 2.

The photoelectric detectors 1 and 2 of FIG. 2 are respectively connected to first and second signal amplitude discriminating circuits 3 and 4 which convert an analog signal into a digital signal. The outputs of these first and second signal amplitude discriminating circuits 3 and 4 are delivered to first and second signal extracting circuits 5 and 6 which extract only necessary signal components, and also are put out to a control circuit 7. A command signal is supplied from the control circuit 7 to the first and second signal amplitude discriminating circuits 3 and 4 and to the signal extracting circuits 5 and 6 and, in accordance with this command signal, signals obtained in the signal extracting circuits 5 and 6 are put out to a signal composing circuit 8.

Figure 3:
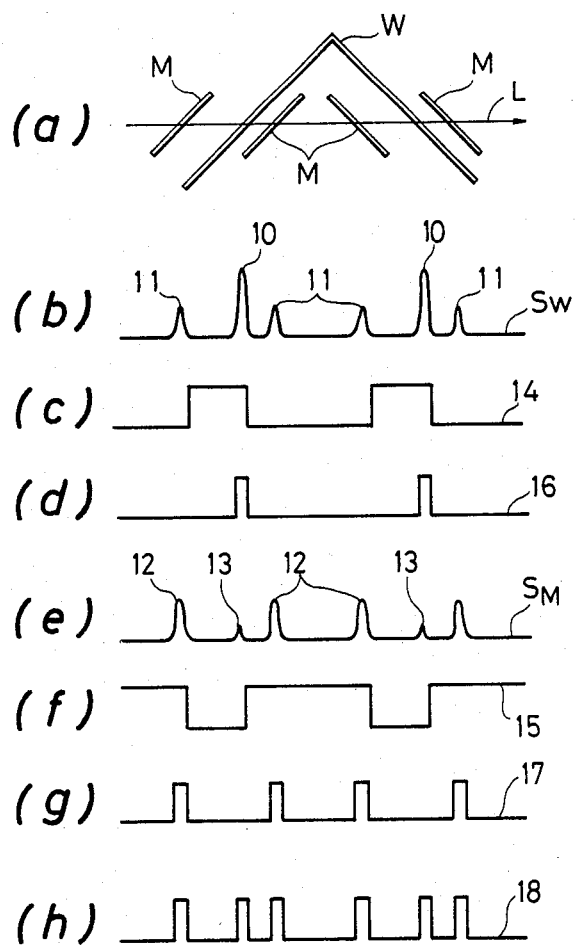
FIG. 3 is a time chart for explaining the operation of the circuit.

When, for example, the mark patterns W and M of the wafer and mask are in a positional relation as shown in part (a) of FIG. 3, the mark pattern W of the wafer is detected by the first photoelectric detector 1 under the scanning of the laser light L. The detection signal $S_W$ detected by the first photoelectric detector 1, as shown in part (b) of FIG. 3, includes, in addition to the pattern signals 10 by the original mark pattern W, unstable signals 11 of the mark pattern M of the mask produced by interference phenomenon. On the other hand, the detection signal $S_M$ shown in part (e) of FIG. 3 detected by the second photoelectric detector 2 includes, in addition to pattern signals 12 based on the mark pattern M of the mask, the signals 13 having low level by the mark pattern W of the wafer. Scanning of the laser light L is effected several times, but these detection signals $S_W$ and $S_M$ are obtained at the time of each scanning.

If, as shown in part (a) of FIG. 3, the positional relation between the mask and the wafer is such that the mark pattern W of the wafer lies between each two parallel ones of the four mark patterns M on the mask, the second and fifth signals in the detection signal $S_W$ shown in part (b) of FIG. 3 and the signal $S_M$ shown in part (e) of FIG. 3 are the signals obtained from the mark pattern W and the remaining, namely, the first, third, fourth and sixth signals, are the signals detected from the mark patterns M.

The following technique is used to extract only the signals 10 representing the mark pattern W on the wafer from the detection signal $S_W$ and only the signals 12 representing the mark patterns M on the mask from the detection signal $S_M$. First, the detection signal $S_W$ or $S_M$ is converted into a digital signal. Then there is created an extraction command signal 14 shown in part (c) of FIG. 3, which is put out at the timing from the end of the first pulse to the end of the second pulse, and from the end of the fourth pulse to the end of the fifth pulse of said converted signal or the signal composed of the two signals $S_W$ and $S_M$, along with a signal 15 shown in part (f) of FIG. 3 which is an inverted signal of the signal 14. Subsequently, by the use of these extraction command signals (c) and (f), the signal 16 for only the mark pattern W on the wafer and the signal 17 for only the mark patterns M on the mask can be extracted. This extraction is accomplished by generating the extraction command signals 14 and 15 in the control circuit 7 from the signals supplied thereto through the first and second signal discriminating circuits 3 and 4, and by delivering the extraction command signals 14 and 15 to the first and second signal extracting circuits 5 and 6. The thus obtained extraction signals 16 and 17 shown in parts (d) and (g) of FIG. 3 are composed by the signal composing circuit 8, whereby there is obtained a stable signal 18 shown in part (h) of FIG. 3 which corresponds to the relative position of the mark patterns W and M on the mask and wafer. This signal 18 can be processed in the same manner as in the prior art to recognize, with high accuracy, the relative position of the mark patterns W and M. Particularly in this case, the unnecessary signals 11 and 13 have been removed and therefore, the resultant composite signal 18 is free of any indistinctness due to the influence of these unnecessary signals.

When the mark patterns W and M are not in the positional relation as shown in part (a) of FIG. 3, that is, for example, when they are disposed in the positional relation as shown in part (a) of FIG. 4, coarse aligning may be effected, in the manner as will now be described, until the positional relation as shown in part (a) of FIG. 3 is attained. That is, the detection signal $S_W$ shown in part (b) of FIG. 4 obtained by the first photoelectric detector 1 and coming back from the wafer and the detection signal $S_M$ shown in part (c) of FIG. 4 detected by the second photoelectric detector 2 and coming back from the mask are converted into digital signals by the first and second signal amplitude discriminating circuits 3 and 4. Thereafter a signal 20 shown in part (d) of FIG. 4 which comprises the digital signals superposed one upon the other is obtained and aligning is effected by the use of the same means as that of the prior art.

In this case, the detection signals $S_W$ and $S_M$ are detected just at the same time and moreover, they include stable signals of the mark patterns W and M of the wafer and mask. Therefore, even if unstable signal components exist in the signals $S_W$ and $S_M$, signal 20 will not have pulses other than six pulses. However, the pulse width may sometimes fluctuate under the influence of unstable signals and therefore, the signal 20 cannot be utilized for the signal processing for highly accurate alignment.

Figure 5:
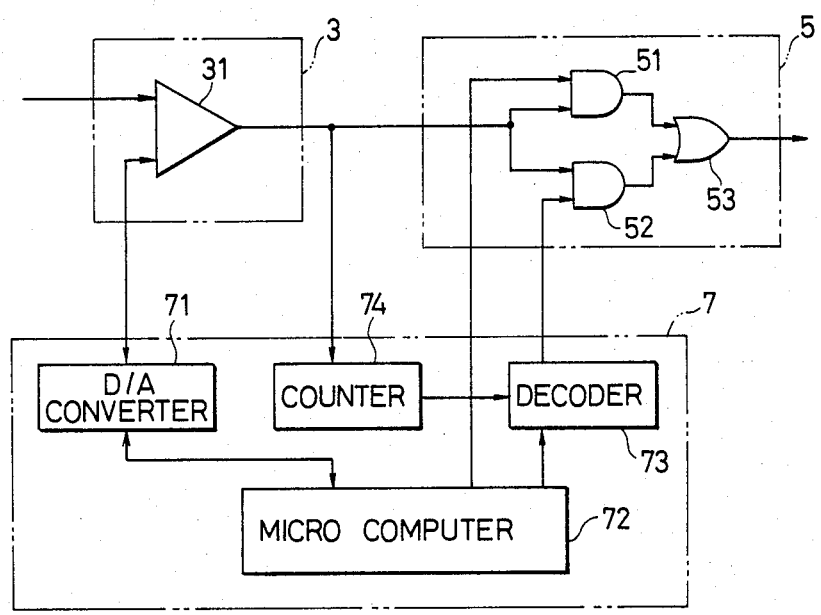
FIG. 5 is a detailed block circuit diagram of the elements shown in FIG. 1.

FIG. 5 shows the details of the signal amplitude discriminating circuit 3, the signal extracting circuit 5 and the control circuit 7 to clarify the functions of the circuit elements shown in FIG. 2. A comparator circuit 31 is included in the signal amplitude discriminating circuit 3 which is adapted to amplitude-discriminate the signal by a potential put out from a D/A converter 71 in the control circuit 7. Logical multiply gates 51 and 52 for extracting only the necessary signal from the digital signal input are provided in the signal extracting circuit 5. The logical multiply gate 51 is directly subjected to the control from a micro computer 72 in the control circuit 7 and the logical multiply gate 52 detects a signal under the control of a decoder 73 in accordance with the order of the pulses. A logical sum gate 53 for selecting the outputs of logical multiply gates 51 and 52 is further provided in the signal extracting circuit 5. The D/A converter 71 converts the digital potential command of the micro computer 72 into an analog potential, a counter circuit 74 counts the pulse number of the signal, and the decoder 73 decodes the count content of the counter circuit 74 and puts out a signal extraction command to the logical multiply gate 52 at required timing. In the case of processing in which extraction command signal 14 shown in FIG. 3(c) is produced, the values "1" and "4" counted by the counter circuit 74 are utilized so that signal 14 is produced between the end of the first pulse and the end of the second pulse, and between the end of the fourth pulse and the end of the fifth pulse as described above. Accordingly, the decoder 73 decodes the count values "1" and "4" and decodes them. The micro computer 72 supplies commands, as required to respective processing components, to the D/A converter 71, the logical multiply gate 51 taking charge of the signal extracting function, and the decoder 73.

Figure 4:
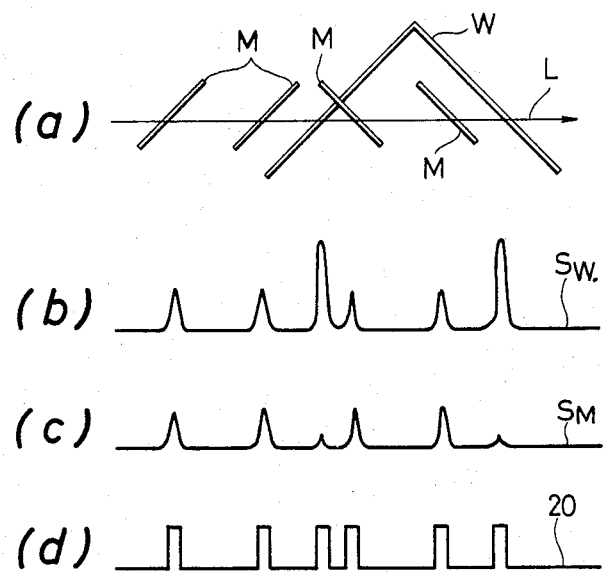
FIG. 4 is a time chart showing the signal waveforms in a case where the relative position of the wafer and mask greatly deviates from the predetermined position due to unsatisfactory installation of wafer.

It is also possible to control the first and second signal extracting circuits 5 and 6 from the control circuit 7 to effect selection such that only the detection signal $S_W$ obtained by the first photoelectric detector 1 is taken out as the output of the signal composing circuit 8 or only the detection signal $S_M$ put out from the second photoelectric detector 2 is taken out as the output of the signal composing circuit 8 or, like the signal 20 shown in FIG. 4(d), the outputs of the detection signals $S_W$ and $S_M$ are superposed one upon the other. Accordingly, when the number of the output signals of the signal composing circuit 8 is over or under a predetermined number, an abnormal condition such as admixture of erroneous signals due to dust or the like or unsatisfactory installation of the mask and wafer can be recognized. Further, where the installed position of the wafer greatly deviates from the standard position, the wafer can be moved, by the coarse automatic aligning described in connection with FIG. 4, to a position whereat the signal processing for higly accurate automatic aligning can be performed. In the described embodiment, the photoelectrically detected detection signals $S_W$ and $S_M$ are immediately converted into digital signals, whereby the processing such as signal extraction or composition is effected. However, the photoelectrically detected analog signals may be directly subjected to the signal processing such as extraction or composition.

The foregoing specific embodiment has been described with reference to a pair of mark patterns of the mask and wafer. However, in order to actually realize two-dimensional alignment of two objects, it is necessary to detect mark patterns at least two positions.

Also, in FIG. 2 there are disposed two photoelectric detectors, but the number of the photoelectric detectors may be increased in some cases.

What we claim is:

1. A signal processing apparatus operable in cooperation with a first object having at least one standard mark thereon and a second object having at least one reference mark thereon, said apparatus comprising:
    first sensing means for sensing said standard mark and generating a first signal stream containing a desirable signal concerning said standard mark and an undesirable signal concerning said reference mark;
    second sensing means for sensing said reference mark and generating a second signal stream containing a desirable signal concerning said reference mark and an undesirable signal concerning said standard mark;
    extracting means for forming a timing signal from at least one of said first and said second signal streams, for extracting the desirable signal concerning said standard mark from said first signal stream by means of said timing signal, and for extracting the desirable signal concerning said reference mark from said second signal stream by means of said timing signal; and
    signal composing means for composing the extracted desirable signal concerning said standard mark and the extracted desirable signal concerning said reference mark.

2. A signal processing apparatus according to claim 1, wherein said extracting means effects extraction as aforesaid with a timing based on the signal stream generated by at least one of said first sensing means and said second sensing means.

3. A signal processing apparatus according to claim 1, wherein said extracting means effects signal extraction as aforesaid with a timing based on a signal composed from the signal streams of said first and said second sensing means.

4. A signal processing apparatus according to claim 1, wherein said first object comprises a mask provided with a semiconductor integrated circuit pattern and said second object comprises a wafer provided with a photoresist layer.

5. A signal processing apparatus according to claim 4, further comprising a projection lens for rendering said mask and said wafer in optically conjugate relation.

6. A signal processing apparatus according to claim 1, further comprising first converter means for converting the signal stream generated by said first sensing means into a digital signal, and second converter means for converting the signal stream generated by said second sensing means into a digital signal.

7. A signal processing apparatus according to claim 6, further comprising means for creating a coarse alignment signal from the outputs of said first converter means and said second converter means.

8. A signal processing apparatus according to claim 1, further comprising means for producing a light beam and scanning means for scanning said standard mark and said reference mark with said light beam.

9. A signal processing method for effecting alignment between a first object having at least one standard mark thereon and a second object having at least one reference mark thereon, said method comprising the steps of:
    sensing the standard mark on the first object and forming a first signal stream containing a desirable signal concerning the standard mark on the first object and an undesirable signal concerning the reference mark on the second object;
    sensing the reference mark on the second object and forming a second signal stream containing a desirable signal concerning the reference mark on the second object and an undesirable signal concerning the standard mark on the first object;
    forming an extraction command signal and a signal inverted from the extraction command signal from at least one of the first signal stream and the second signal stream;
    forming an extracted signal concerning the standard mark on the first object from said first signal stream and said extraction command signal;
    forming an extracted signal concerning the reference mark on the second object from said second signal stream and the inverted extraction command signal; and
    composing a composite signal from the extracted signal concerning the standard mark and the extracted signal concerning the reference mark and utilizing this composite signal to effect alignment between the first object and the second object.

* * * * *